United States Patent
Zivic

(12) 
(10) Patent No.: US 6,444,504 B1
(45) Date of Patent: Sep. 3, 2002

(54) MULTILAYER ZNO POLYCRYSTALLIN DIODE

(76) Inventor: Zoran Zivic, Skofjeloiska 21, 1215 Medvode (SI)

( * ) Notice: Subject to any disclaimer, the term of this patent is extended or adjusted under 35 U.S.C. 154(b) by 0 days.

(21) Appl. No.: 09/579,152

(22) Filed: May 25, 2000

Related U.S. Application Data

(62) Division of application No. 09/101,520, filed as application No. PCT/SI97/00029 on Nov. 10, 1997, now Pat. No. 6,316,819.

(51) Int. Cl.[7] .............................................. H01L 21/00
(52) U.S. Cl. ..................................... 438/133; 361/321
(58) Field of Search ..................... 338/20, 21; 252/512, 252/518; 438/237, 133; 361/321; 428/329

(56) References Cited

U.S. PATENT DOCUMENTS

| | | | | |
|---|---|---|---|---|
| 4,165,351 A | * | 8/1979 | May | 264/66 |
| 4,290,041 A | * | 9/1981 | Utsumi et al. | 338/21 |
| 4,510,112 A | * | 4/1985 | Lauf | 264/234 |
| 4,527,146 A | * | 7/1985 | Al | 338/21 |
| 4,729,058 A | * | 3/1988 | Gupta et al. | 361/321 |
| 4,811,164 A | * | 3/1989 | Ling et al. | 361/321 |
| 4,959,262 A | * | 9/1990 | Charles et al. | 428/329 |
| 5,369,390 A | | 11/1994 | Lin et al. | |

FOREIGN PATENT DOCUMENTS

| | | | | |
|---|---|---|---|---|
| EP | 0 189 087 | 1/1986 | | H01C/7/10 |

OTHER PUBLICATIONS

Dalay, Ü., et al, "Excess Capacitance of ZnO–Au Varactors", Appl. Phys., A42, pp. 249–255 (1987).

* cited by examiner

Primary Examiner—Savitri Mulpuri

(57) ABSTRACT

A method of manufacturing a multilayer ZnO polycrystalline diode that protects against electrostatic discharges, over-current, and voltage surges overcoming the aforementioned drawbacks is provided. The present invention further includes preparing a plurality of oxide additives and homogenizing the oxide additives with ZnO. A plurality of polycrystalline layers is then formed having a thickness of approximately 20 to 60 microns. The method further includes forming a plurality of polycrystalline layers, each having a thickness of approximately 20 to 60 microns, printing an inner electrode on each polycrystalline layer, forming a compact block with the polycrystalline layers, cutting the compact block into a plurality of chips, scorching and sintering the plurality of chips, forming a plurality of outer electrodes, scorching the outer electrodes, and placing at least two of the outer electrodes on each chip.

18 Claims, 7 Drawing Sheets

MULTILAYER ZNO POLYCRYSTALLIN DIODE

CROSS-REFERENCE TO RELATED APPLICATION

This application is a divisional of U.S. application Ser. No. 09/101,520, filed Nov. 12, 1998, now U.S. Pat. No. 6,316,819 entitled Multilayer ZnO Polycrystalline Diode, which claims the benefit of 371 International Application Serial No. PCT/SI97/00029, filed Nov. 10, 1997 and Slovenia Application Serial No. P-9600331, filed Nov. 11, 1996.

BACKGROUND OF THE INVENTION

This invention belongs to field of electronic components and more specifically into multifunctional and/or multipurpose electronic elements. Such elements provide simultaneous and independent exploitation of several electric properties, which are result of activity of various physical mechanisms, in common material structure. Even more narrow definition places this invention in the field of polycrystalline semiconductor diodes.

Diode of this invention differs from standard planar monocrystalline Si based diodes, as it provides higher capacitance with stable temperature and wide range of frequency properties, which enables the diode to perform condenser function. Capacitance of this newly disclosed diode may be controllable altered, by the means of voltage, which provides similar function as known for varactor diodes (word varactor is developed from variable reactor).

I—U characteristic of the subject diode is not linear and a pulse mode breakthrough is not destructive, which provides similar function as known for Zener protective diodes.

BRIEF SUMMARY OF THE INVENTION

A method of manufacturing a multilayer ZnO polycrystalline diode that protects against electrostatic discharges, over-current, and voltage surges overcoming the aforementioned drawbacks is provided. The present invention further includes preparing a plurality of oxide additives and homogenizing the oxide additives with ZnO. A plurality of polycrystalline layers is then formed having a thickness of approximately 20 to 60 microns. The method further includes forming a plurality of polycrystalline layers, each having a thickness of approximately 20 to 60 microns, printing an inner electrode on each polycrystalline layer, forming a compact block with the polycrystalline layers, cutting the compact block into a plurality of chips, scorching and sintering the plurality of chips, forming a plurality of outer electrodes, scorching the outer electrodes, and placing at least two of the outer electrodes on each chip.

There are four basic problems, from aspects of use of planar Silicon (Si) diodes as protective elements:

1. In voltage range v<4V Si diodes have high leakage current (reverse current) and high negative breakthrough coefficient, which excludes Si diodes from above voltage range, as protective elements.

2. Energy absorption capability of Si protective diodes, at higher voltage, is very limited. This is due the planar construction and small volume of reduced P—N area, where all absorbed energy is concentrated, respectively. Any increase of absorption capability of diodes automatically claims increase of their dimensions, and as result price, which is not in accordance to demands of contemporary electronic and microelectronic.

3. In many various applications, especially when voltage stroke and frequency disturbance appear simultaneous, the protective element shall have capacitance as high as possible. The capacitance of Si Zener diodes is usually small therefore normally condenser is parallely added.

4. Use of Si planar diodes as SMD elements, due their construction, demands mounting in special plastic housings, which additionally increases their dimensions and price.

Technical problem solved with this invention arises from special and general demands of electronics for contemporary protective components.

a) Special Demands
1. Widest possible operating voltage rang of diode
2. Non-destructive and temperature independent breakthrough
3. Relatively high capacitance, stable in wide temperature and frequency range
4. Controllable change of capacitance by means of voltage in whole range of operating voltage b) General Demands
1. Ilimitability of small and large dimensions
2. Choice and change of electrical parameters in wide range
3. Possibility of surface mounting P—N junction and potential barrier on it respectively represents base of functioning of the most elementary active semiconductor two terminal component diode. The most commonly used material for manufacturing semiconductor diodes is silicon monocrystalline. Selective and controlled forming of N, N+ type areas respectively, and P, P+ type respectively is achieved with diffusion or ionic implantation in such manner that the most of formed P—N junction is located in monocrystaline depth, where the surface remains even, thus planar (planar technology). Depending on doping profile, geometry, and polarization conditions, diode offers various useful functions for different types of applications.

Breakthrough I—V characteristic of planar diodes is very non-linear, which provides use of diodes as protective elements against electrostatic discharge and voltage strokes. Namely, at lower voltages, through diode current is very low however, when electric field on P—N junction reaches certain value (about $10^6$V/cm) diode resistance rapidly decreases and very high current runs through the diode. Such diode behaviour is caused by two different mechanisms: a) tunnel effect; and b) avalanche like multiplication, where the value of breakthrough voltage mostly depends on width of reduced area and dope level respectively of N and P area. Both mechanisms are often very actively used in various fields of application, one of the fields being protection.

Tunnel effect is known for Si diodes, with breakthrough voltage vp,$4E_g/q$ ($E_g$-semiconductor suppressed band energy, q-elementary charge). As $E_g$ with increasing temperature decreases, such diodes have expressly negative temperature coefficient. Further more, leakage current of such diodes in breakthrough area is very high, which disables them to function as protective elements, especially at DC electronic circuits. If breakthrough voltage $Vp>6E_g/q$ than avalanche like multiplication is basic breakthrough mechanism. In such case breakthrough voltage is positive and breakthrough voltage is increasing with temperature. If diode breakthrough voltage $4E_g/q<Vp<6E_g/q$, both breakthrough mechanisms function at the same time.

Regardless to the fact that capacitance, as result of reduced area of P—N junction, is one of its basic features, diodes are exceptionally used as condenser, however mostly in special cases. This is due to low dielectric constant of silicon ($\epsilon$=11.9), low value of surface capacitance (<10 nF/cm2) and due to limits of planar technology, which are also related to price.

Wideness and capacitance of reduced area is directly related to its voltage. This is utilised in varactor diode, where capacitance may be controllable altered with voltage. Because of these properties varactor diodes are widely used in parameter boosters, harmonisation generators, signal mixing systems, detectors and as voltage altered trimmers for precise setting of resonance frequency. Beside high sensitivity (s>3) of temporary varactor diodes with hyper gradient junction in some applications they show deficiency, e.g. relatively low value of nominal capacitance, large dimensions and incapacity of surface mounting. It is obvious that possibilities of planar Si technology are limited, when all demands of contemporary protective electronic components must be fulfilled. This is especially case when necessary for the component to have the highest possible capacitance (e.g. frequency disturbance filtration) or when very high and frequent energy loads are present (electricity in automobiles).

Some of above mentioned problems could be solved using new materials and structures. European patent EP 41 8394A of Matsushita Company, introduced multilayer condenser based on $SrTiO_3$ semiconductor, which has varistor characteristic. Because of high value of $\epsilon$ (i.e.>15000), such condenser provides very high capacity, varistor function being worse side of this product. Namely in prebreakthrough area varistor characteristic has high leakage current, thus highest operating DC value must 50% lower, compared to varistor breakthrough. Further more non-linearity coefficient a does not exceed value 15, which makes efficiency of the protection very limited. U.S. Pat. No. 4,811,164 introduces condenser—varistor, monolith multilayer component, composed from two different materials in such manner, that one multilayer package is composed from dielectric ceramics based on $BaTiO_3$, having $\epsilon$>10000 and is closely bonded with second multilayer package, made of ZnO varistor ceramics. Both packages are sintered together and from monolith chip component, composed of two different materials, which both maintain their basic condenser and varistor properties, thus they combine these properties in one component. U.S. Pat. No. 4,729,058 introduces self-limiting multilayer condenser, based on multi compound system composed of oxides of the following elements: Zn, alkali metals, B, Co, Si, Bi in Al. In that patent authors T. K. Gupta and W. D. Straub discus influence of design and mutual disposition of internal electrodes to capacitance and resistance and breakthrough voltage of self-limiting condenser.

DETAILED DESCRIPTION OF THE INVENTION

Subject of present invention is multiplayer zinc oxide diode, which is multifunctional component. Multifunctionality of diode of present invention comes out from fact, that beside symmetrical and very non-linear I—V characteristic of ZnO the diode has stable and optional capacitance ranging from some ten pF to some ten nF. Capacitance of ZnO diode may be controllable altered in range from 10% to 30%, with voltage.

Key for understanding of operating and construction of ZnO semiconductor diode is in understanding physics and electrical properties of ZnO surface and border line between two ZnO grains, which is also the smallest possible ZnO diode and elementary element for ZnO polycrystalline diode.

ZnO is semiconductor of type N, with free carrier concentration $n=10^{16}$ $cm^{-3}$ and wideness of suppressed band $E_g$=3.35 eV. $Bi_2O_3$ is basically weak dielectric. These two materials are elemental compositions of ZnO diode. Namely MIS diode (Metal Insulator Semiconductor), with structure as shown in FIG. 1, has extremely non-linear I—V characteristic ($\alpha$=60–100) in inverse polarization (1) as shown in FIG. 2, the breakthrough voltage value depending on $Bi_2O_3$ thickness. In direct polarization (2) I—U characteristic shows much lower non-linear characteristic. $Bi_2O_3$ is know as one of the best ionic conductors, which is confirmed by its I—U characteristic (3) in FIG. 2. When $Bi_2O_3$ is doped with above elements, e.g. Co or rare earth elements, such as Y, Pr, Nb etc., ionic conductivity of $Bi_2O_3$ decreases on account of increased gap conductivity. In both bases electronic conductivity is very low. Thus MIS diode of structure $Bi_2O_3$—ZnO, with inverse polarisation provides good non-linear I—V characteristic.

C—V characteristic of such diode is shown in FIG. 3. C—V relation proves existence of negative charge on intersurface of $Bi_2O_3$—ZnO and existence of reduced area ($\cong$100 nm) on the ZnO side and existence of potential barrier on the border line between $Bi_2O_3$—ZnO, which is restored to maintain electro neutrality on the border between two systems. Therefore at lower voltage, through current will be low and as a result of thermal ionic emission over the barrier also temperature dependent. Further increase of inverse voltage on MIS diode will result in surface inversion, i.e. hole concentration (minority carriers in ZnO) becomes higher than concentration of electrons. Namely, inverse voltage is divided between dielectric and reduced area, arid electrical field on top of the barrier could reach value about 2 MV/cm. Under these circumstances the electrons coming over the barrier will gain enough kinetic energy (they become "hot") to initiate shock ionization and start creating electron-hole pairs. Intersurface gaps compensate part of negative charge and instantly reduce potential barrier, which enables rapid increase of current, i.e. breakthrough.

Voltage at which an inversion is reached, (i.e. breakthrough starting point) is called threshold. Threshold value $V_T$ is from 3.3 and 3.8 V and above all it is function of the $Bi_2O_3$ thickness, charge concentration on intersurface and free carrier concentration in ZnO. Thus not much depending on temperature (i.e. temperature coefficient has small negative value), as experimentally confirmed.

To create symmetric, very non-linear I—V characteristic, which would be independent from direction of polarisation, symmetric SIS structure (Semiconductor Insulator Semiconductor) as shown in FIG. 4. In such case, both dielectrics on one and another side form potential barriers with equal properties. Thus, regardless to the direction of polarization, one of MIS eiodes is inverse polarized, which provides non-linear I—U characteristic in both directions, as shown in FIG. 5. It is obvious, that conductivity of such diodes, influenced by voltage changes rapidly, from very low (at $V<V_T$) up to very high (at $V\geq V_T$) and that in both areas, different conducting mechanisms exist.

Elements having such characteristic (i.e. variable conductivity) may be designated as VARICON (VARiable CONductivity).

Equivalent electric scheme of ZnO diode is shown in FIG. 6, where $R_{Zno}$ is ZnO resistance, Ci—dielectric capacitance, $R_D$—reduced area resistance and CD—reduced area capacitance. Thus serial connection of number n of such diodes will increase breakthrough voltage of diode equivalent, which may be calculated as $V_n$=$nV_T$. On the other hand, parallel connection of number n of such diodes increases capacitance of diode equivalent, which may be calculated as $C_N$=$nC_D$.

A great number of such serial and parallel connections of elementary ZnO diodes are found in polycrystalline system ZnO—$Bi_2O_3$. At heat treatment sintering of dust mixture of these two materials polycrystalline structure is formed, which is composed from grown ZnO grains and surrounding phase of $Bi_2O_3$. Balance layer $Bi_2O_3$ with thickness of 2–10 nm is always formed between two ZnO grains. Thickness of this layer does not dependent on beginning concentration of $Bi_2O_3$, or way of processing. This means that structure of borderline between two grains is repeatable in entire volume of polycrystalline material, which provides great number of primitive ZnO diodes having very similar properties. Due to improvement of electric properties of mentioned materials it is necessary to add some other oxide materials, such as: Mn, Co, Nb, etc., which are $Bi_2O_3$ conductivity modifiers, and regulators of concentration and distribution of surface condition on the border line of ZnO; Fe as concentration regulator of free carriers in ZnO; Sb as regulator of uniformity and ZnO grain growth speed thus porosity regulator of polycrystalline material.

Optimal ZnO diode forming structure having preferred properties is multilayer structure in from of chip (4) as shown in FIG. 7. Such structure is composed from a number of equally thin (15–300 μm) polycrystalline layers (5) among which thin (5–15 μm) metal layers (Ag, Pd, Pt, mixtures or alloys thereof in various proportions) are placed—inner electrodes (6), (7) in such manner, that each second electrode is shifted in opposite direction, so only one, the smallest edge ends in the smallest lateral side of the chip. Other edges of inner electrodes are surrounded with polycrystalline material. All inner electrodes ending on one side of the chip (6) are mutually connected with metal layer, which represents outer electrode (8). Similar description may be applied for all inner electrodes, ending on the opposite side of the chip (7). Outer electrodes on both lateral sides of the chip (8), (9) provide mutual electrical connection between every second inner electrodes in such manner, that between outer electrodes of the chip, parallel connection of ZnO polycrystalline diodes, represented by thin polycrystalline layer (5) with corresponding electrodes on each side (6) and (7) exists. All polycrystalline and inner metal layers together form compact low porous monolith structure. Basic electrical parameters (i.e. breakthrough voltage and capacitance of ZnO diode) may be influenced by parameters of multilayer structure.

Breakthrough voltage $V_N$ depends on ZnO grains number in the cross section of the polycrystalline layer between two adjacent inner electrodes and its thickness respectively. Combination of ZnO grains dimension and layer thickness may provide breakthrough voltage in range from 4 V to 150 V. Capacitance $C_N$ depends on dielectric constant of polycrystalline material, in our case varying in range $\epsilon$=900–1400, on thickens and number of polycrystalline layers in the structure. Therefore it is possible to provide capacitance in range from 100 pF–100 nF with real chip dimensions from 1 mm to 10 mm. Capacitance linearly decreases with increasing of DC voltage in whole operating range of voltage. This provides controllable altering from 10% to 30%.

BRIEF DESCRIPTION OF THE DRAWINGS

The drawings illustrate the best mode presently contemplated for carrying out the invention.

In the drawings.

For manufacturing of ZnO polycrystalline diodes we used mixture of oxide material dusts of following structure and weight percentage: ZnO-(91.75%), $Bi_2O_3$-(3%), $Sb_2O_3$-(3.5%), $Mn_3O_4$-(0.8%), $Co_3O_4$-(0.7%), $Fe_2O_3$-(0.05%) in $Nb_2O_5$-(0.2%). After homogenisation the materials were prereacted at 650° C. for two hours. After grinding and drying, an organic system composed of organic binders, plastificator, dispersive, solvent and other additives to forming stable suspension, was added into the above mentioned mixture. After 20 hours stirring, the suspension was used for pouring of thin foil with 30–60 μm thickness, using Doctor blade System. Foils were dried 48 hours and cut to smaller sheets of 13×13 cm, which were later used to form multilayer structure. Inner electrodes, made of silver (85%) and palladium (15% ) were placed on the foils with printing technique. In this way formed multilayer structure was than pressed ($2 \times 10^4$ KPa, 70° C.) and compact blocks were formed.

Blocks were cut into chips, which were then treated in rotating drum, to round edges. After degasification of organic materials at 600° C. the chips were scorched-sintered at 1050° C. temperature. Silver electrodes, separately scorched at 620° C., were placed on sintered chips. Groups A and B of ZnO diode chips, all having same dimension (5,7 mm×5 mm), equal number of inner electrodes, but different polycrystalline layer thickness between adjacent inner electrodes, namely 35 μm and 100 μm, were made using above described procedure. Basic electric results of both ZnO diodes are shown in Table 1.

TABLE 1

| | Electric parameters of ZnO diode | | | | |
|---|---|---|---|---|---|
| Diode | Layer thickness (μm) | $V_N$ (V) | α 1–10 mA | C nF | δC/C % |
| A | 35 | 8.2 | 24 | 16 | 9.8 |
| B | 100 | 34 | 36 | 10 | 18 |

Above results show, that new ZnO polycrystalline diode of this invention, regardless to the thickness of the polycrystalline layer and value of breakthrough voltage, has high value of non-linearity coefficient α. Further more, the breakthrough voltage is very stable. Temperature coefficient $T_k$ measured for diode A was $T_k$=−0.001%/°C., while it was for diode B $T_k$=−0.01%/°C. Diodes may hold high current and energetic loads without significant consequences. For instance diode B holds current load over 2000 A at 8/20 μs impulse or 20 J of energetic load at 10/1000 as impulse. Above results show that new ZnO diode of the present invention may be successfully used as protective element against electrostatic discharge and voltage and current strokes.

Figure 1:
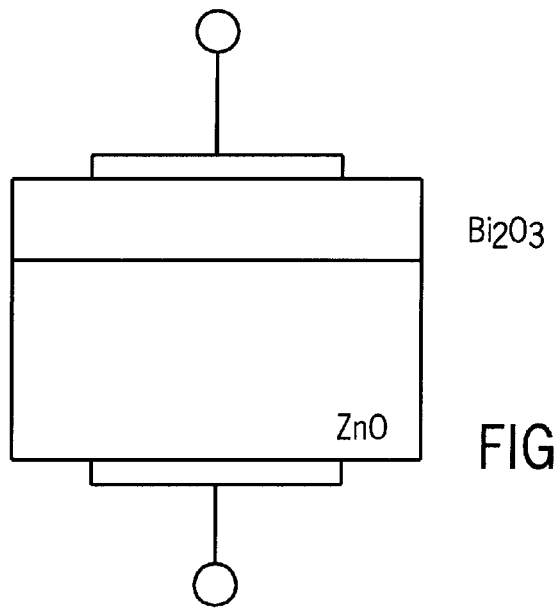
FIG. 1 is a schematic diagram of a preferred embodiment of the present invention.
Figure 2:
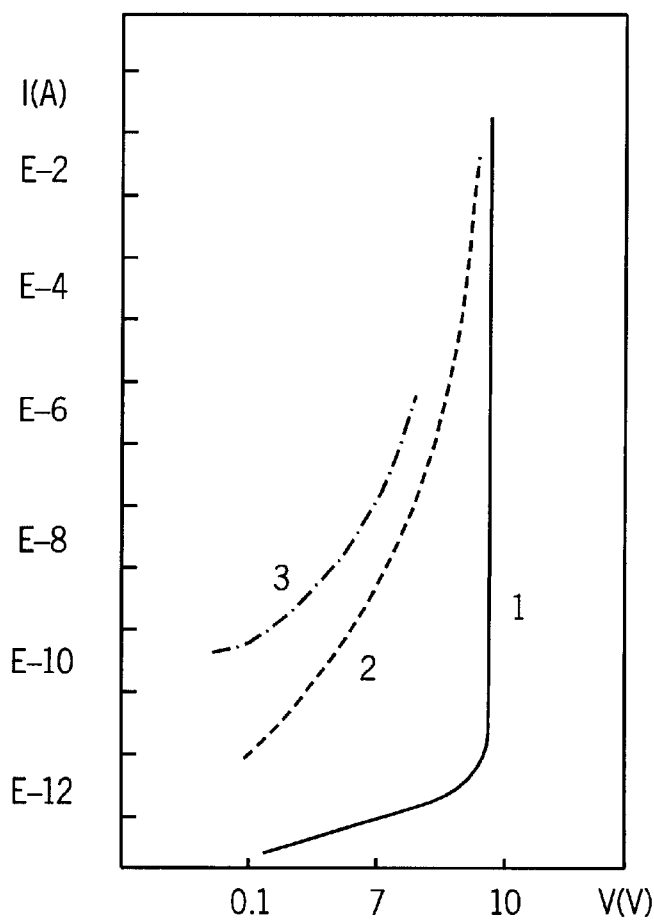
FIG. 2 is a graph illustrating characteristics of the present invention shown in FIG. 1.
Figure 3:
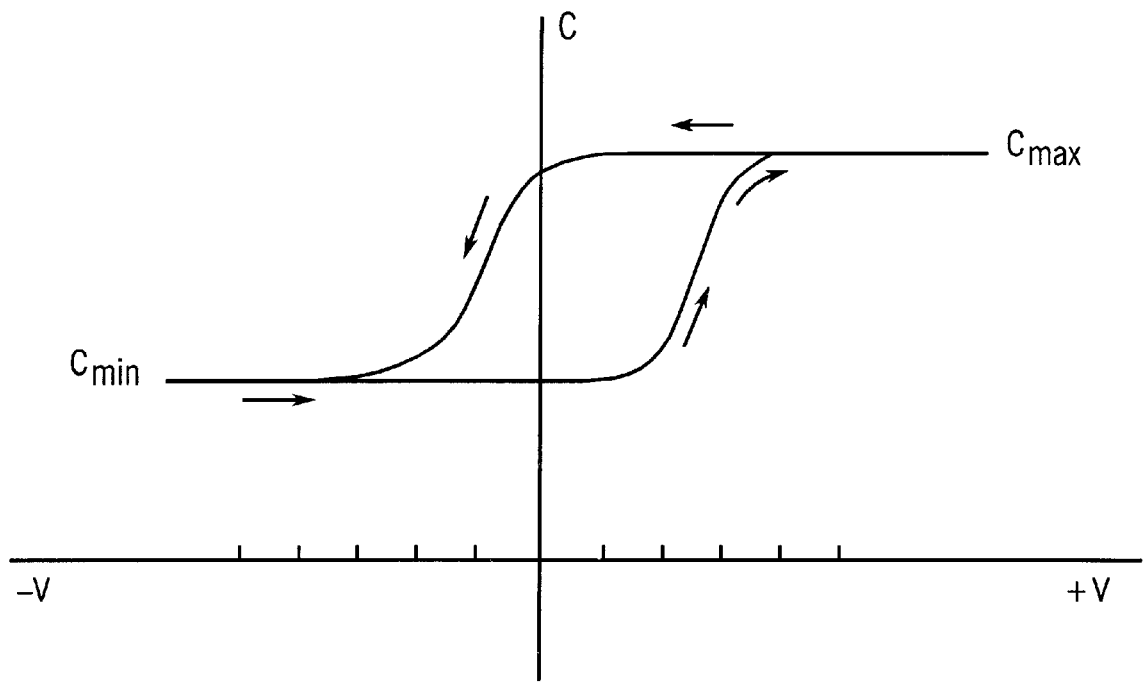
FIG. 3 is a graph further illustrating additional characteristics of the present invention shown FIG. 1.
Figure 4:
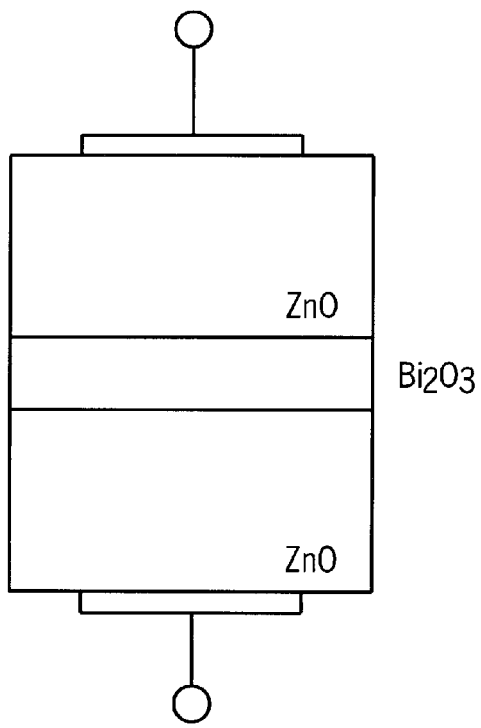
FIG. 4 is a schematic diagram of an alternate embodiment of the present invention.
Figure 5:
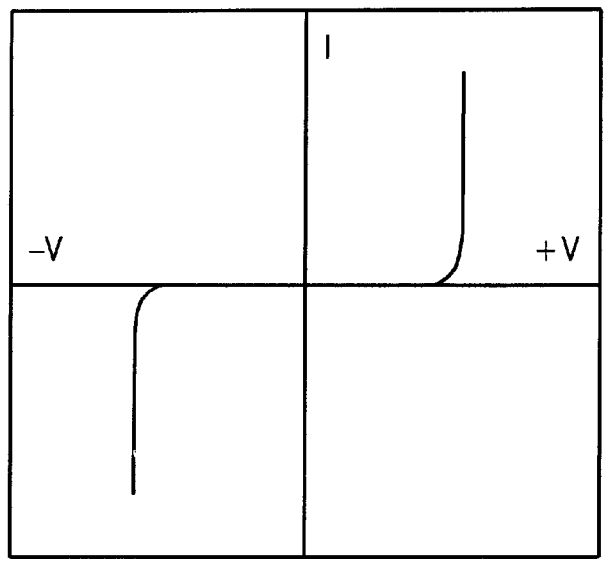
FIG. 5 is a graph illustrating characteristics of the present invention shown in FIG. 4.
Figure 6:
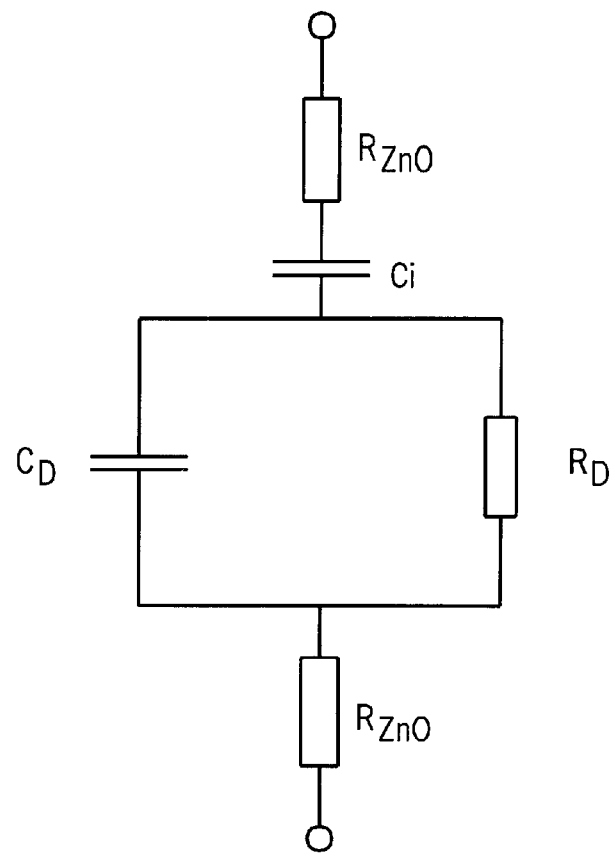
FIG. 6 is a schematic of an equivalent circuit in accordance with the present invention.
Figure 7:
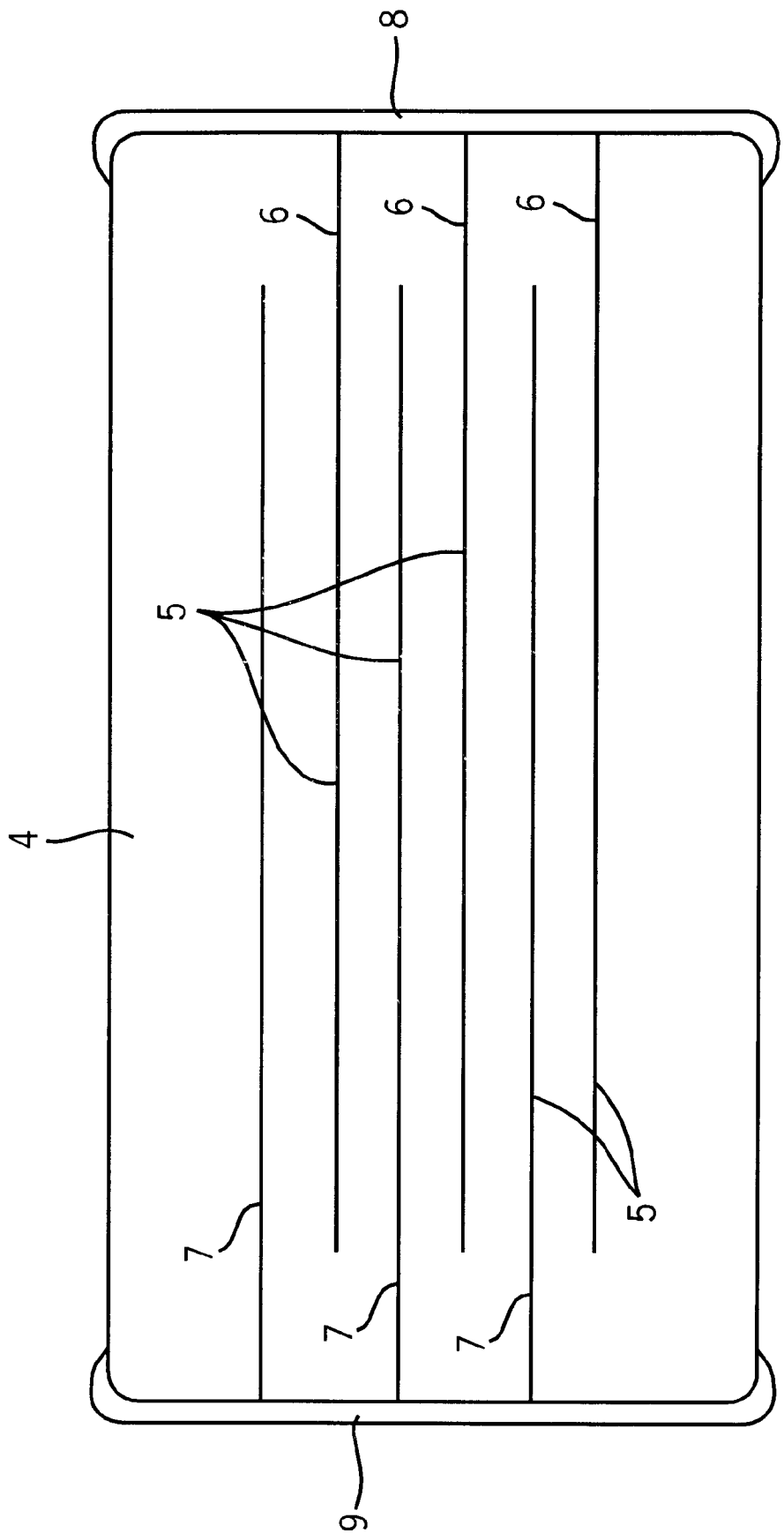
FIG. 7 is schematic diagram of another embodiment of the present invention.
Figure 8A:
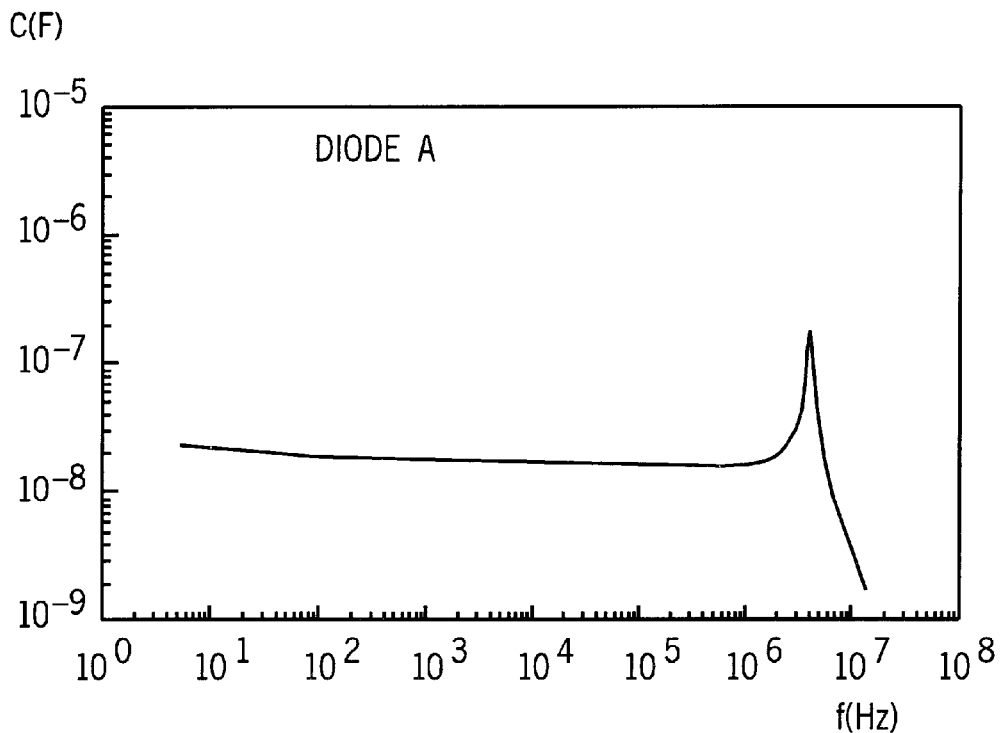
FIGS. 8A and 8B are graphs illustrating characteristics of the present invention.
Figure 8B:
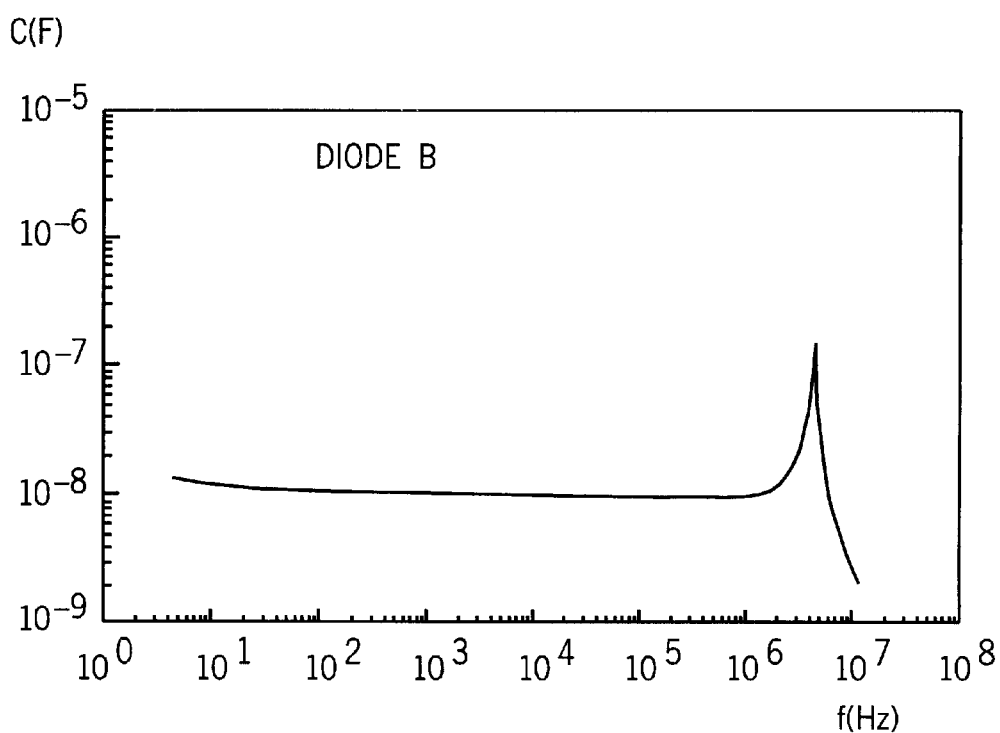
Figure 9A:
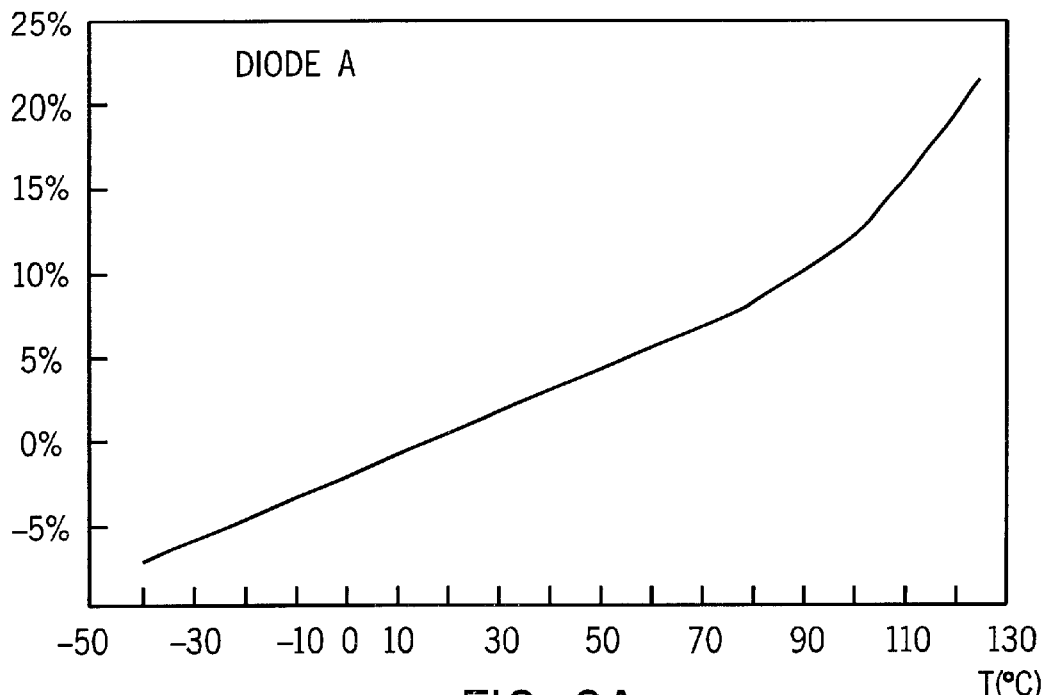
FIGS. 9A and 9B are graphs illustrating characteristics of the present invention.
Figure 9B:
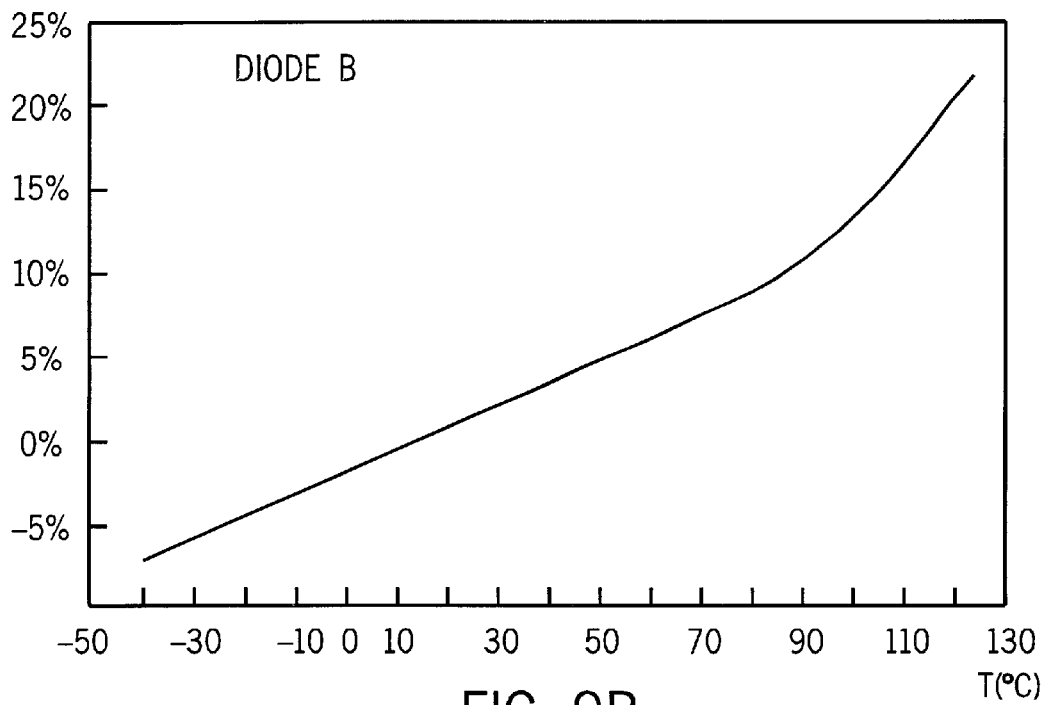
Figure 10A:
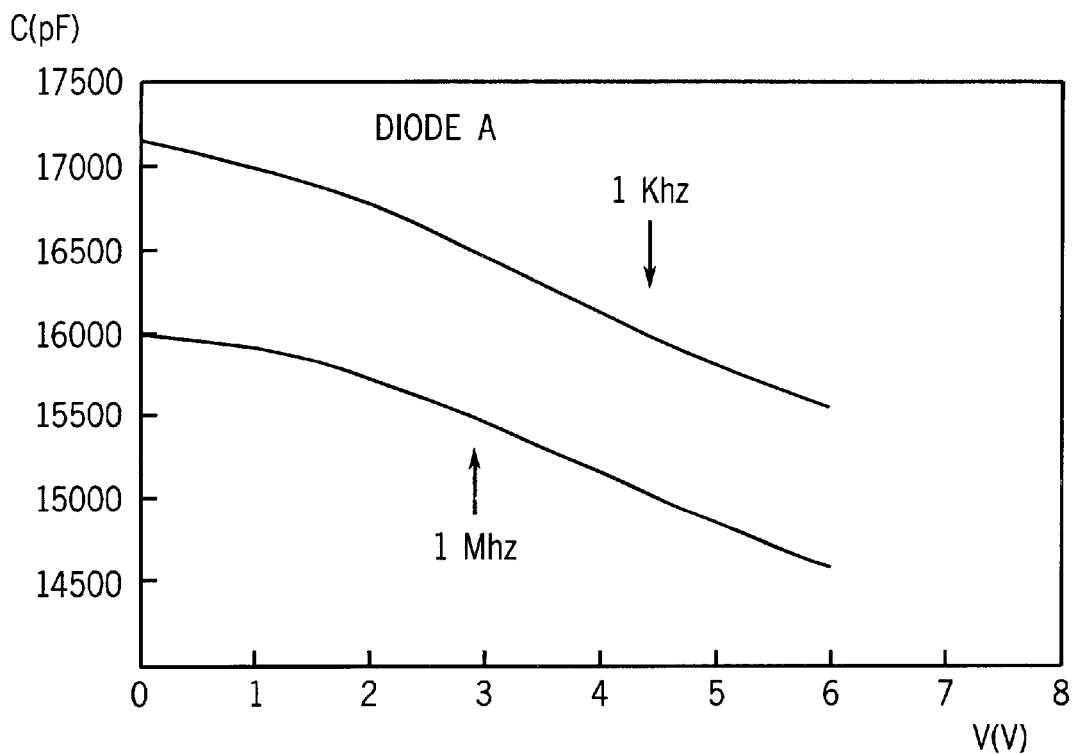
FIGS. 10A and 10B are graphs further illustrating characteristics of the present invention.
Figure 10B:
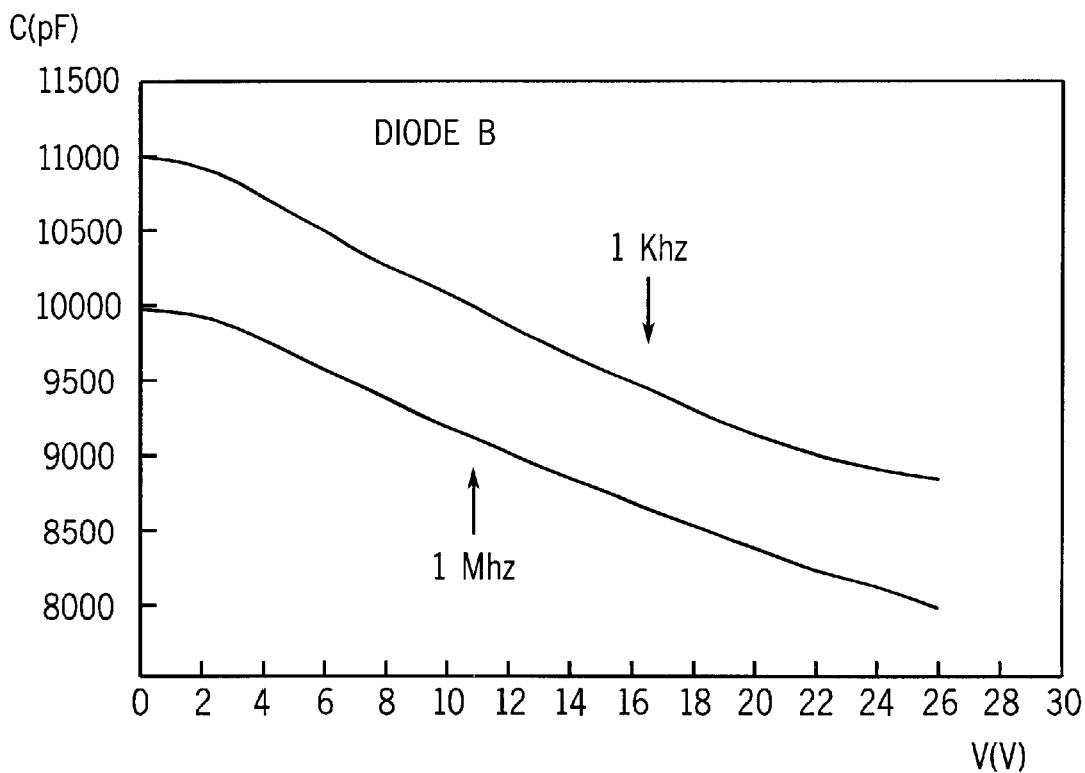

Capacitance of ZnO diodes A and B differs only by factor of difference of polycrystalline layer thickness. This means, that dielectric constant value of described material of ZnO diode, under conditions of stable processing is stable as well. Beside that capacitance in both cases (diodes A and B) is very stable infrequency range up to 1 Mhz, as show in FIGS. 8A and 8B. In temperature range from −40 to +85° C. capacitance of this new ZnO diode is linearly increasing with temperature. Change of capacitance amounts only to ±8%. Further increasing of temperature results in less linear temperature-capacitance dependence, as shown in FIG. 9. At 125° C. temperature, capacitance change comes to less than 23%. Above results show that this new ZnO diode may also be used as condenser, especially in higher temperature range, because ZnO is not limited with Currie temperature as the most commonly used dielectric $BaTiO_3$. When ZnO diode is used as condenser, it's highest operating voltage is limited with breakthrough voltage of the diode, the operating temperature being 20–25% lower. If voltage higher than condenser operating voltage occurs the diode goes towards breakthrough, so practically protecting "it's" condenser. This provides self-protection of the condenser. Further more the ZnO diode may be used not only as condenser, but even as controllable altered condenser. FIG. 10 shows capacitance-voltage dependence of diodes A and B. With exception of lower voltage values, this change is linear in the whole operating voltage range of the condenser, and it amounts to 9.8% for diode A and 19.5% for diode B.

Subject of this invention, multilayer ZnO polycrystalline diode, is new element that simultaneously combines functions of three different elements, namely protective Si diode, Si varactor diode and condenser.

I claim:

1. A method of manufacturing a multilayer ZnO polycrystalline diode comprising the steps of:
    (a) preparing a plurality of oxide additives selected from the group consisting of $Bi_2O_3$, $Mn_3O_4$, $Co_3O_4$, $Sb_2O_3$, $Fe_2O_3$, and $Nb_2O_5$;
    (b) homogenizing the plurality of oxide additives with ZnO;
    (c) forming a plurality of polycrystalline layers, each having a thickness of approximately 20 to 60 microns;
    (d) printing an inner electrode on each polycrystalline layer;
    (e) forming a compact block with the polycrystalline layers;
    (f) cutting the compact block into a plurality of chips;
    (g) scorching and sintering the plurality of chips;
    (h) forming a plurality of outer electrodes;
    (i) scorching the outer electrodes; and
    (j) placing at least two of the outer electrodes on each chip.

2. The method of claim 1 further including the step of pre-reacting the ZnO at a temperature of approximately 650° for approximately 2 hours.

3. The method of claim 1 further including the steps of:
    pre-homogenizing a plurality of oxide additives selected from the group consisting of $Bi_2O_3$, $Mn_3O_4$, $Co_3O_4$, $Sb_2O_3$, $Fe_2O_3$, and $Nb_2O_5$;
    grinding the plurality of oxide additives
    pre-reacting the plurality of oxide additives at a temperature of approximately 650° C. for a period of approximately 2 hours; and
    repeatedly scorching the plurality of oxide additives.

4. The method of claim 1 further including the step of adding a plurality of polycrystalline layers each having a thickness of 20 to 60 microns together to form a polycrystalline layer greater than 60 microns.

5. The method of claim 1 wherein the scorching and sintering of the chips step is performed at a temperature of approximately 1050° C.

6. The method of claim 1 wherein the forming of the plurality of outer electrodes step includes forming the plurality of outer electrodes with one of silver and a mixture of silver and palladium, and wherein the scorching the outer electrodes step further includes scorching the plurality of outer electrodes to a temperature of approximately 620° C.

7. A method of manufacturing a multilayer ZnO polycrystalline diode comprising the steps of:
    (a) preparing a plurality of oxide additives selected from the group consisting of $Bi_2O_3$, $Mn_3O_4$, $Co_3O_4$, $Sb_2O_3$, $Fe_2O_3$, and $Nb_2O_5$;
    (b) homogenizing the plurality of oxide additives with ZnO;
    (c) forming a plurality of polycrystalline layers, each having a thickness of approximately 20 to 60 microns;
    (d) printing an inner electrode on each polycrystalline layer;
    (e) forming a compact block with the polycrystalline layers;
    (f) cutting the compact block into a plurality of chips;
    (g) scorching and sintering the plurality of chips;
    (h) forming a plurality of outer electrodes;
    (i) scorching the outer electrodes separately from the plurality of chips; and
    (j) placing at least two of the outer electrodes on each chip.

8. The method of claim 7 further comprising the step of pre-reacting the ZnO at a temperature of approximately 650° for approximately 2 hours.

9. The method of claim 7 further comprising the steps of:
    pre-homogenizing a plurality of oxide additives selected from the group consisting of $Bi_2O_3$, $Mn_3O_4$, $Co_3O_4$, $Sb_2O_3$, $Fe_2O_3$, and $Nb_2O_5$;
    grinding the plurality of oxide additives;
    pre-reacting the plurality of oxide additives at a temperature of approximately 650° C. for a period of approximately 2 hours; and
    repeatedly scorching the plurality of oxide additives.

10. The method of claim 7 further comprising the step of adding a plurality of polycrystalline layers each having a thickness of 20 to 60 microns together to form a polycrystalline layer greater than 60 microns.

11. The method of claim 7 further comprising the step of scorching and sintering the chips at a temperature of approximately 1050° C.

12. The method of claim 1 further comprising the step of forming the plurality of outer electrodes with one of silver and a mixture of silver and palladium, and wherein the scorching the outer electrodes step further includes scorching the plurality of outer electrodes to a temperature of approximately 620° C.

13. A method of manufacturing a multilayer ZnO polycrystalline diode comprising the steps of:
    (a) preparing a plurality of oxide additives selected from the group consisting of $Bi_2O_3$, $Mn_3O_4$, $Co_3O_4$, $Sb_2O_3$, $Fe_2O_3$, and $Nb_2O_5$;
    (b) homogenizing the plurality of oxide additives with ZnO;

(c) forming a plurality of polycrystalline layers, each having a thickness of approximately 20 to 60 microns;

(d) printing an inner electrode on each polycrystalline layer;

(e) forming a compact block with the polycrystalline layers;

(f) cutting the compact block into a plurality of chips;

(g) scorching and sintering the plurality of chips;

(h) forming a plurality of outer electrodes;

(i) separately scorching the outer electrodes from the plurality of chips; and (j) placing at least two of the outer electrodes on each chip.

14. The method of claim 13 further comprising the step of pre-reacting the ZnO at a temperature of approximately 650 for approximately 2 hours.

15. The method of claim 13 further comprising the steps of:

pre-homogenizing a plurality of oxide additives selected from the group consisting of $Bi_2O_3$, $Mn_3O_4$, $Co_3O_4$, $Sb_2O_3$, $Fe_2O_3$, and $Nb_2O_5$;

grinding the plurality of oxide additives;

pre-reacting the plurality of oxide additives at a temperature of approximately 650° C. for a period of approximately 2 hours; and repeatedly scorching the plurality of oxide additives.

16. The method of claim 13 further comprising the step of adding a plurality of polycrystalline layers each having a thickness of 20 to 60 microns together to form a polycrystalline layer greater than 60 microns.

17. The method of claim 13 further comprising the step of scorching and sintering the chips steps at a temperature of approximately 1050° C.

18. The method of claim 13 further comprising the step of forming the plurality of outer electrodes with one of silver and a mixture of silver and palladium, and wherein the scorching the outer electrodes step further includes scorching the plurality of outer electrodes to a temperature of approximately 620° C.

* * * * *

UNITED STATES PATENT AND TRADEMARK OFFICE
CERTIFICATE OF CORRECTION

PATENT NO. : 6,444,504 B1
DATED : September 3, 2002
INVENTOR(S) : Zoran Zivic

It is certified that error appears in the above-identified patent and that said Letters Patent is hereby corrected as shown below:

<u>Title page, Item [54] and Column 1, line 1,</u>
Delete "ZNO POLYCRYSTALLIN" and substitute therefor -- ZnO POLYCRYSTALLINE --;

<u>Column 3,</u>
Line 27, delete the word "a" and substitute therefore -- $\alpha$ --;
Line 64, delete "n $\equiv 10^{16}$" and substitute therefore -- n $\cong 10^{16}$ --;

<u>Column 4,</u>
Line 16, delete "$\equiv 100$" and substitute therefore -- $\cong 100$ --;
Line 51, delete "V $\geqq$ V$_T$" and substitute therefore -- V $\geq$ V$_T$ --;

<u>Column 6,</u>
Line 62, delete "T$_k$ = -0.001%ºC." and substitute therefore -- T$_k$ = -0.001%/ºC --;
Line 66, delete "as" and substitute therefore -- $\mu$s --;

<u>Column 9,</u>
Line 16, delete "650" and substitute therefor -- 650º --.

Signed and Sealed this

Seventh Day of January, 2003

JAMES E. ROGAN
*Director of the United States Patent and Trademark Office*